US009082738B2

(12) United States Patent
Talbot et al.

(10) Patent No.: US 9,082,738 B2
(45) Date of Patent: Jul. 14, 2015

(54) SEMICONDUCTOR PACKAGE WITH IMPROVED THERMAL PROPERTIES

(71) Applicant: NXP B. V., Eindhoven (NL)

(72) Inventors: Pascal Talbot, Mouen (FR); Olivier Tesson, Bretteville l'Orgueilleuse (FR)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/718,856

(22) Filed: Dec. 18, 2012

(65) Prior Publication Data

US 2013/0181336 A1    Jul. 18, 2013

(30) Foreign Application Priority Data

Jan. 5, 2012    (EP) .................................... 12290005

(51) Int. Cl.

| | |
|---|---|
| *H01L 23/34* | (2006.01) |
| *H01L 21/56* | (2006.01) |
| *H01L 23/31* | (2006.01) |
| *H01L 23/538* | (2006.01) |
| *H01L 23/36* | (2006.01) |
| *H01L 23/00* | (2006.01) |

(52) U.S. Cl.
CPC ............... *H01L 23/34* (2013.01); *H01L 21/56* (2013.01); *H01L 23/3121* (2013.01); *H01L 23/36* (2013.01); *H01L 23/5389* (2013.01); *H01L 24/19* (2013.01); *H01L 24/96* (2013.01); *H01L 2224/04105* (2013.01); *H01L 2224/32245* (2013.01); *H01L 2924/10253* (2013.01); *H01L 2924/1421* (2013.01); *H01L 2924/3025* (2013.01)

(58) Field of Classification Search
USPC ......... 257/713, 712, 717, 720, 675, 737, 738, 257/734, 784, 786, 684, E23.174, 690; 438/122

See application file for complete search history.

(56) References Cited

U.S. PATENT DOCUMENTS

| | | | | |
|---|---|---|---|---|
| 8,349,658 | B2 * | 1/2013 | Chi et al. ....................... | 438/123 |
| 2004/0217459 | A1 * | 11/2004 | Fee et al. ..................... | 257/684 |
| 2005/0200006 | A1 | 9/2005 | Pu et al. | |
| 2007/0054439 | A1 * | 3/2007 | Yang .............................. | 438/127 |
| 2007/0108560 | A1 * | 5/2007 | Tang et al. .................... | 257/666 |
| 2008/0157342 | A1 * | 7/2008 | Yang ............................. | 257/700 |
| 2009/0004317 | A1 * | 1/2009 | Hu et al. ....................... | 425/352 |
| 2009/0039491 | A1 | 2/2009 | Kim et al. | |
| 2009/0176348 | A1 * | 7/2009 | Griffiths ........................ | 438/458 |
| 2009/0224400 | A1 * | 9/2009 | Rahman ........................ | 257/713 |

(Continued)

FOREIGN PATENT DOCUMENTS

WO    2010/106515 A1    9/2010

OTHER PUBLICATIONS

Extended European Search Report for Application No. 12290005.3 (Jun. 15, 2012).

*Primary Examiner* — Alexander Oscar Williams

(57) ABSTRACT

A semiconductor package, comprises an encapsulant which contains a semiconductor substrate, the package lower side being mountable on a surface. The semiconductor substrate backside is in close proximity of the semiconductor package lower side for improved thermal conductivity to the surface. The active side of the semiconductor substrate, facing the upper side of the semiconductor package, has a plurality of die contacts. A plurality of electrically conductive interconnects are connected to the die contacts and extend to the lower side of the semiconductor package for connecting the die contacts to the surface.

17 Claims, 7 Drawing Sheets

(56) References Cited

U.S. PATENT DOCUMENTS

| | | | |
|---|---|---|---|
| 2009/0321925 A1* | 12/2009 | Gealer et al. | 257/729 |
| 2010/0052119 A1* | 3/2010 | Liu | 257/666 |
| 2010/0237471 A1 | 9/2010 | Pagaila et al. | |
| 2010/0289095 A1 | 11/2010 | Poeppel et al. | |
| 2011/0068468 A1* | 3/2011 | Lin et al. | 257/737 |
| 2011/0156237 A1 | 6/2011 | Gulpen et al. | |
| 2011/0291249 A1* | 12/2011 | Chi et al. | 257/675 |
| 2012/0248620 A1* | 10/2012 | Kurita | 257/773 |
| 2013/0105970 A1* | 5/2013 | Chi et al. | 257/737 |
| 2013/0256856 A1* | 10/2013 | Mahler et al. | 257/676 |
| 2013/0320518 A1* | 12/2013 | Chun | 257/712 |

* cited by examiner

SEMICONDUCTOR PACKAGE WITH IMPROVED THERMAL PROPERTIES

CROSS-REFERENCE TO RELATED APPLICATIONS

This application claims the priority under 35 U.S.C. §119 of European patent application no. 12290005.3, filed on Jan. 5, 2012 the contents of which are incorporated by reference herein.

FIELD OF THE INVENTION

This invention relates to a semiconductor package.

BACKGROUND OF THE INVENTION

Semiconductor substrates or chips are commonly used in a variety of applications.

Semiconductor device manufacturing is typically divided into front end (FE) processes, which include steps for producing the semiconductor substrate of the device including its various components, and back end (BE) processes, which include assembling the substrate into some form of package.

Thus, during manufacture, after the FE production processes are completed, a back end (BE) production process, also called assembly, will follow. During known BE processes, the chip is taken out of a wafer semiconductor substrate whereon the chip is fabricated in vast numbers. This is known as singulation. Frequently the semiconductor chip is then encapsulated in a molding composition, creating a package, where die contacts of the active side of the semiconductor is routed to one nearby plane of the package for electrical connection. This package is mountable on a surface such as a printed circuit board (PCB). The packaged chip may be mounted together with other devices on the PCB, so as to provide for the electronic functionality of a particular product.

With the ongoing FE miniaturization the BE production process needs to keep up. Due to this miniaturization, not only do chips become smaller in area, but also an increased functionality is generally incorporated within this smaller area. The latter gives rise to more input and output signals as to channel and regulate the enhanced functionality. Ever more input and output signals on ever smaller silicon chip areas has in part lead to the strain in the BE process to keep up with miniaturization. Moreover, there are additional constraints on the BE process caused by a need for smaller footprints and smaller form factors (physical dimensions) of the semiconductor packages. This need stems from smaller and thinner end-products, for example tablet PC's, smart phones, multi media carriers and portable end-products. For these reasons the BE production process is under a continuous strain.

One of the recent advancements in this field (US 2011/0156237 A1) deals with the problem described above by routing electrically conductive interconnects from the die contacts to a pad ring located on the outer perimeter of one plane of the package as to maximize the usable surface available for surface bonding using solder balls.

Another advancement in this field (WO/2010/106515) deals with the structural aspects of how to create a small package which still maintains mechanical stability and reliability.

An important factor in these kinds of semiconductor packages is heat dissipation. As the functionality and the number of active devices in a chip increases, so does the heat dissipation requirement of the package used. Although this is very much dependant on the type of application, it can be seen that high frequency applications with increasing miniaturization at some point will test the boundaries, resulting in an increased junction temperature. This can seriously degrade the electronic functionality of the chip. It can introduce thermal noise or other nonlinear behavior if, for example, a large temperature gradient exists in the active area of the chip.

One method to remedy this is to attach a heat spreader on top of the package, enhancing the thermal dissipation of the package to the surrounding air. Another method is not to dissipate to air, but to the surface on which the package is mounted. This can be achieved by attaching one side of the heat spreader to the package and connecting the other side to the surface (e.g. PCB) thereby creating a thermal conduction path from the top of the package to the surface. Yet another way is by forced cooling, using a fan to force air over the package.

All these methods aid a reduction of the package temperature. However, the efficiency in substantially enhancing the thermal conductivity from the package to the surrounding environment is for some of these methods, limited. Additionally, some of these known methods are expensive and oftentimes incompatible with continual demands for ever smaller form factors of the package.

US2010/237471 describes a plurality of semiconductor dies mounted to a carrier separated by a peripheral region. An insulating material is deposited in the peripheral region. A first opening is formed in the insulating material of the peripheral region to a first depth. A second opening is formed in the insulating material of the peripheral region centered over the first opening to a second depth less than the first depth. The first and second openings constitute a composite through organic via (TOV) having a first width in a vertical region of the first opening and a second width in a vertical region of the second opening.

US 2009/039491 describes a semiconductor package including a first insulating body and a first semiconductor chip having a first active surface and a first back surface opposite the first active surface. The first semiconductor chip is disposed within the first insulating body. The first active surface is exposed by the first insulating body. The first back surface is substantially surrounded by the first insulating body.

US 2010/289095 describes a semiconductor device comprising a semiconductor chip defining a first face and a second face opposite to the first face, the semiconductor chip comprising at least one contact element on the first face of the semiconductor chip, an encapsulating body encapsulating the semiconductor chip, the encapsulating body having a first face and a second face opposite to the first face, a redistribution layer extending over the semiconductor chip and the first face of the encapsulating body and containing a metallization layer comprising contact areas connected with the contact elements of the semiconductor chip, an array of external contact elements located on the second phase of the encapsulating body.

Accordingly, a need exists for a better inherent thermal conductive coupling between a semiconductor package and the surface upon which it can be mounted.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided; a semiconductor package comprising: an encapsulant comprising: an upper side; and a lower side mountable on a surface; a semiconductor substrate in the encapsulant, the substrate comprising: a backside proximal the lower side of the encapsulant for thermal connection to the surface; and an active side distal the lower side of the encapsulant, the active side of the substrate including a plurality of die contacts; a plurality of electrically conductive interconnects extending to the lower surface of the encapsulant for electrically connecting the die contacts of the substrate to the surface, and a heat spreader in thermal contact with the backside of the semiconductor substrate for aiding thermal connection to the surface.

The resulting structure allows a physical separation of roles for electrical and thermal conduction to the surface. The backside of the semiconductor substrate is in close proximity to the lower side, and is thereby available for heat dissipation directly to the surface. This enhances the thermal conductive coupling between the semiconductor package and the surface. Additionally, electrically conductive interconnects extend through the encapsulant to the lower surface, allowing electrical connection to the die contacts of the substrate, notwithstanding the fact that they are located on the active side of the substrate, which is itself located distal the lower side of the encapsulant.

According to one embodiment, a redistribution layer can be used in order to make better use of the area provided by the package encapsulant. For small semiconductor substrates this can address area constraints per die contact by increasing the area available for mounting techniques such as those using solder balls.

According to another embodiment, the redistribution layer can be electrically connected to a pad ring located at the opposing side of the package. Vertically oriented electrically conductive interconnects (for example, vias) running through the encapsulant can connect the redistribution layer with the pad ring.

The heat spreader can comprise a thermally conductive material (e.g. it can be metallic). The heat spreader can aid an enhanced thermal conductive coupling to the surface.

According to another embodiment the backside of the substrate can coincide with the surface of the lower side of the encapsulant. This can facilitate fabrication of the heat spreader on a planar surface.

According to another embodiment, the backside of the semiconductor substrate can be recessed with respect to the lower side of the encapsulant. This recessed area can be filled with a thermally conductive material up to the level of the lower side of the encapsulant, enabling fabrication of a heat spreader on top of this planar area.

According to another embodiment, parts of the recessed area can be filled with thermally conductive material reaching from the level of the lower side of the encapsulant to the backside of the semiconductor substrate.

According to another embodiment, the recessed area can comprise a plurality of vias which are filled with thermal conductive (e.g. metallic) material.

According to another embodiment the semiconductor substrate can comprise a Radio Frequency circuit.

According to another embodiment the heat spreader is operable to perform an electrical function, for example applying a back bias, or for electrical shielding.

According to another embodiment the heat spreader is tied to ground.

According to another aspect of the invention, there is provided; a method of making a semiconductor package having improved thermal conduction to a surface, the method comprising; providing a semiconductor substrate having an active side and an opposing backside; applying an encapsulant for enclosing the semiconductor body such that the backside of the substrate is proximal to a lower side of the encapsulant; wherein the lower side of the encapsulant is mountable on said surface; connecting a plurality of electrically conductive interconnects to die contacts on the active side of the semiconductor substrate for connecting the die contacts to the lower side of the encapsulant, and providing a heat spreader in thermal contact with the backside of the semiconductor substrate for aiding thermal connection to the surface.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Figure 1:
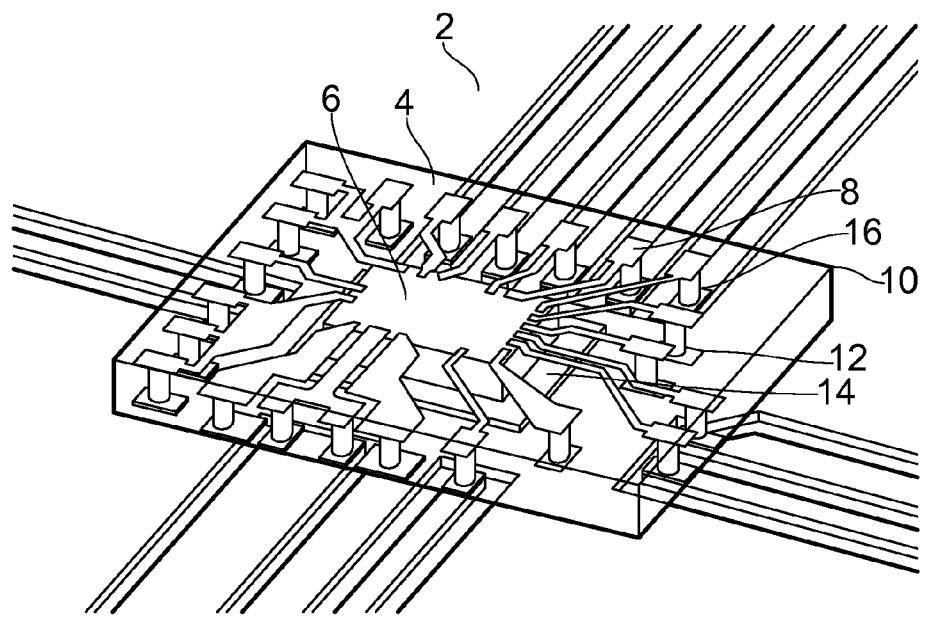
FIG. 1 shows an illustrative example semiconductor package according to various embodiments.

FIG. 1 shows an example of a semiconductor package 10 according to an embodiment of the invention. As shown in FIG. 1, the semiconductor package 10 includes a semiconductor substrate 6, with in this example the active side facing upward. As is well known in the art, active side of a semiconductor substrate is typically the side of the substrate that includes components such as transistors, capacitors and other circuitry. The semiconductor substrate 6 is embedded in an encapsulant 4, which is electrically insulating and which can provide mechanical support and protection for the semiconductor substrate 6. Electrically conductive interconnects are connected to the semiconductor substrate 6 at the upper side of the semiconductor package 10. These interconnects are laterally spread out and fed through the encapsulant 4 to a pad ring 12 located at a lower side of the encapsulant 4. In particular, in the present embodiment, a redistribution layer 8 connects to the die contacts (not shown in FIG. 1), which are part of the semiconductor substrate 6. The redistribution layer 8 extends the electrical conductive interconnects from the die contacts on the substrate, towards the outer perimeter of the semiconductor package 10. It will be understood that the positioning of the outer part of the redistribution layer 8 is not limited to an evenly spaced configuration along the perimeter of the semiconductor package 10. An uneven spacing along the perimeter or an extension of the electrically conductive interconnects from the die contacts to a position anywhere on the surface of the semiconductor package 10 is also contemplated.

The electrically conductive interconnects also pass through the encapsulant via vertically oriented conductive portions 16. The vertically oriented conductive portions 16 connect the redistribution layer 8 at the upper side of the semiconductor package 10 to the pad ring 12 located at the lower side of the semiconductor package 10. A heat spreader 14 is located near the lower side of the semiconductor package 10, and is thermally connected to the back side of the silicon substrate 6. The described embodiment of the semiconductor package 10 allows for a physical separation of the electrically conductive interconnects and the thermal coupling to a surface where the semiconductor package 10 can be mounted on, for example a printed circuit board 2. The insulating encapsulant 4 ensures the integrity of separate isolated electrically conductive interconnects, as well as an electrically isolated heat spreader 14. Similarly as the pad ring 12 can be connected to a printed circuit board 2, so can the heat spreader 14. The printed circuit board 2 provides for the corresponding electrical connections for the pad ring to connect to, for the heat spreader it may provide for both a thermal and an electrical coupling.

Figure 2:
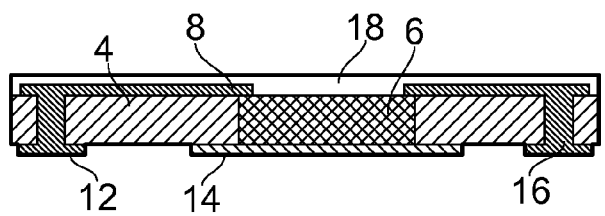
FIG. 2 shows one illustrative example of one embodiment, where the heat spreader is positioned on the back side of the semiconductor substrate and the lower side of the package.

FIG. 2 shows a cross sectional view of one example of a semiconductor package 10 of the kind described in FIG. 1. In this embodiment, the back side of the silicon substrate 6 coincides with the lower side of the semiconductor package 10. This facilitates fabrication of a heat spreader 14 at the lower side of the semiconductor package 10 where a direct thermal contact between the backside of the semiconductor substrate 10 to the heat spreader 14 is aided. The active side of the semiconductor substrate 6, as well as the redistribution layer 8 on top of the semiconductor package 10, may be protected from the environment by a passivation or overmolding layer 18. This layer can provide additional protection to the device against, for example, moisture.

Figure 3:
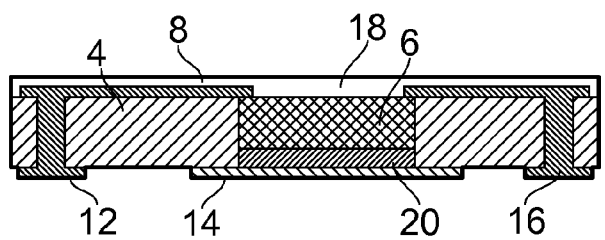
FIG. 3 shows one illustrative example of one embodiment, where the heat spreader is positioned on top of thermally conductive material and the lower side of the package.
Figure 4:
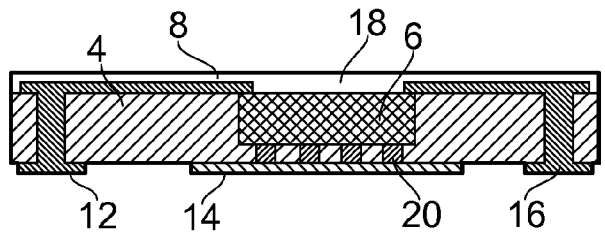
FIG. 4 shows one illustrative example of one embodiment, where the heat spreader is positioned on both thermally conductive material as well as the lower side of the package.

FIG. 3 shows a cross sectional view of another example of a semiconductor package 10 of the kind described in FIG. 1. In this embodiment, the back side of the silicon substrate 6 is recessed with respect to the lower side of the semiconductor package 10. The recessed volume is filled with a thermally conductive material 20 up to the level of the lower side of the semiconductor package 10. The so created planar lower side of the semiconductor package 10 facilitates the fabrication of a heat spreader 14 in this embodiment. The thermally conductive material aids a good thermal coupling between the back side of the silicon substrate 6 and the heat spreader 14.

FIG. 3 shows a cross sectional view of a further example of a semiconductor package 10 of the kind described in FIG. 1. In this embodiment, the back side of the silicon substrate 6 is again recessed with respect to the lower side of the semiconductor package 10. In addition, the encapsulant 4, enclosing the silicon substrate 6, is removed only partially from the silicon substrate 6 backside. Those areas where the encapsulant 4 has been removed (provided in the form of, for example, vias through the encapsulant) are filled with a thermally conductive material 20 up to the lower level of the semiconductor package 10. The so created planar lower side of the semiconductor package 10 facilitates the fabrication of a heat spreader 14 to this embodiment.

Figure 5A:
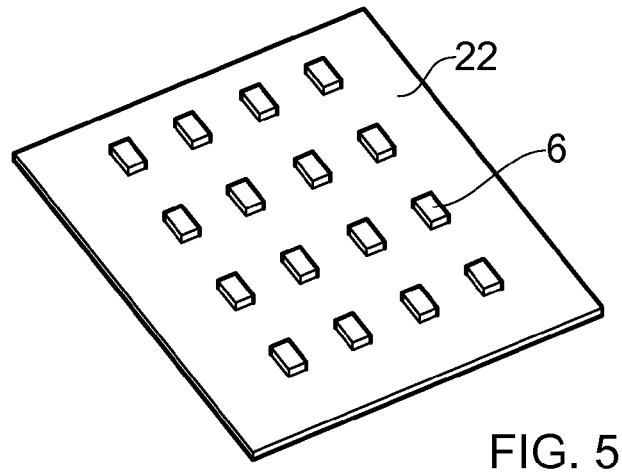
FIG. 5A to 5L show a method of making a semiconductor package.

FIG. 5A describes illustrative examples of steps and processes of making one embodiment of the semiconductor package 10. In FIG. 5A the semiconductor substrate 6 is placed on a first temporary support structure 22, the active side facing the first temporary support structure 22. The configuration shows a multitude of semiconductor substrates 6 arranged in a regular array which is indicative of a mass production process, however also other arrangements are contemplated.

Figure 5B:
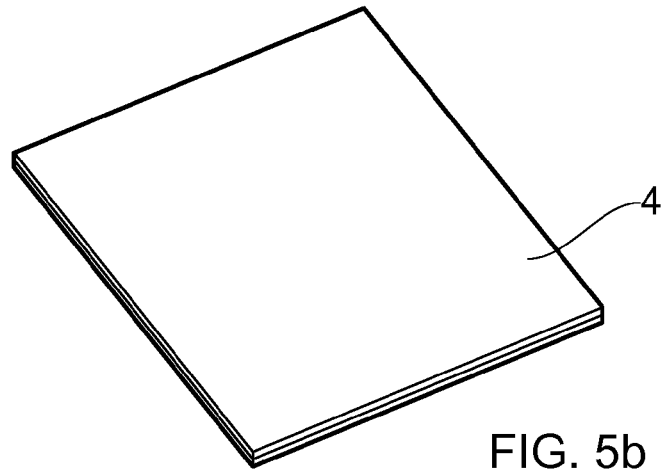

In FIG. 5B the structure is embedded in an encapsulant 4. The encapsulant 4 may be for example a polymeric molding composition or an epoxy resin. The encapsulant 4 provides, for example, support to the semiconductor substrate 6 and it also facilitates the mass fabrication aspect.

Figure 5C:
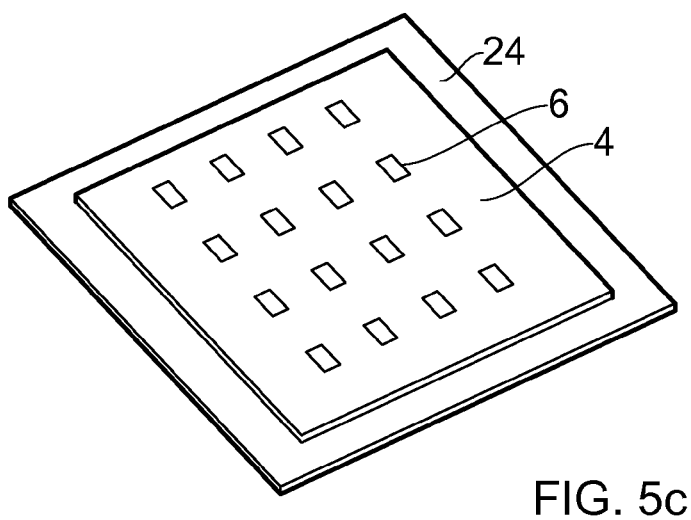

FIG. 5C shows a second temporary support structure 24 which is attached to the exposed side of the encapsulant 4. The first temporary support structure 22 has been removed thus showing the active side of the semiconductor substrate 6.

Figure 5D:
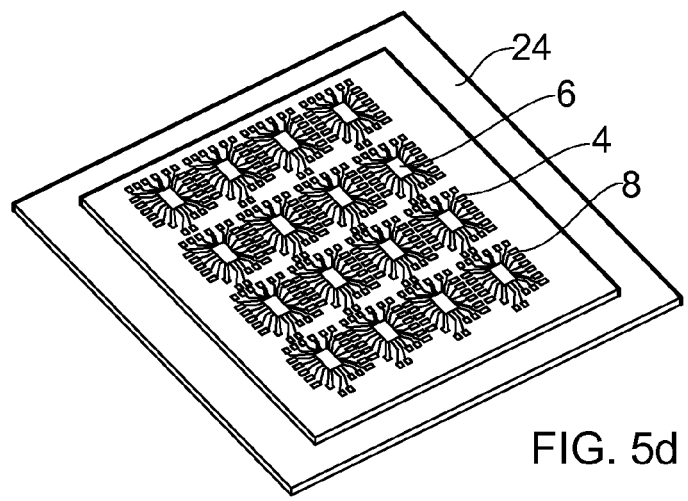

The redistribution layer 8 described herein can comprise a good electrically conductive material, such as a metal for example copper, chromium, silver, aluminium, or gold. This material may be deposited on an optional metal based barrier liner of a material such as for example titanium/titanium nitride, chromium, nickel. Deposition of the metal layer or metal stack may be deposited using PVD, CVD, electroplating, electroless plating processes or a combination thereof, or any other suitable technique. After deposition of the metal or metal stack of the redistribution layer 8 it is patterned to give it its final shape. This may be obtained by laser etching, or applying a photo mask followed by reactive ion etching or wet etching or any other suitable etch technique. FIG. 5D shows the completed redistribution layer 8. The redistribution layer 8 connects to the die contacts on the active side of the semiconductor substrate 6 and spreads the electrically conductive interconnects laterally outward.

Figure 5E:
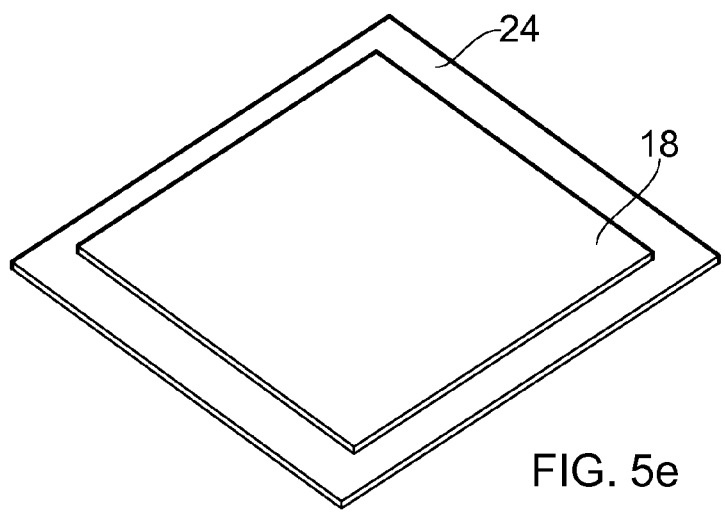

In FIG. 5E, a passivation or overmolding layer 18 is deposited on top of the redistribution layer 8. This protects both the active side of the semiconductor substrate 6 as well as the redistribution layer 8 from ambient influences. It may consist of silicon dioxide, silicon nitride, silicon oxynitride, aluminium oxide, or other materials having similar insulating properties.

Figure 5F:
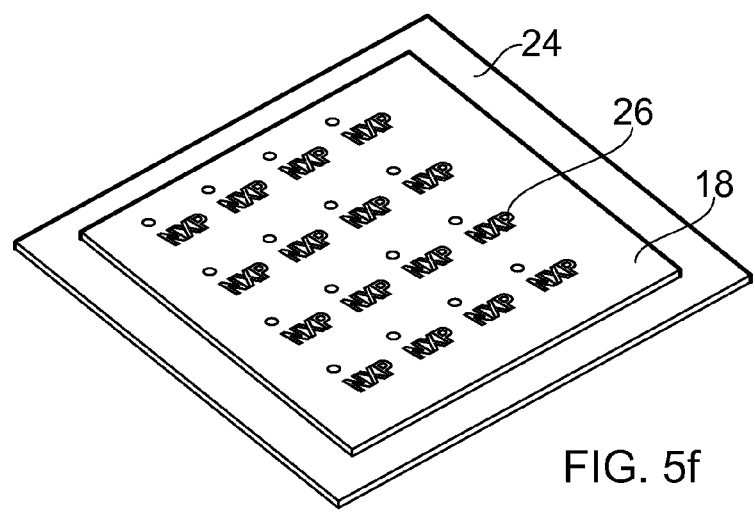

The passivation or overmolding layer 18 can be etched or laser marked as shown in FIG. 5F for product identification purposes.

Figure 5G:
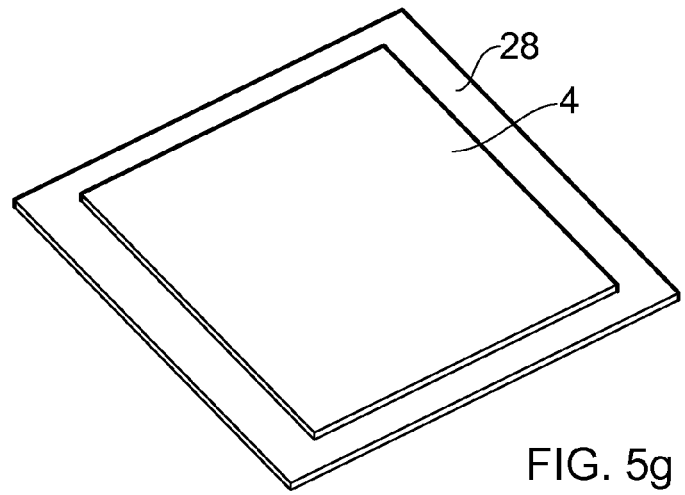

FIG. 5G shows the structure attached to a third temporary support structure 28 facing the passivation or overmolding layer 18, the second temporary support structure 24 has been removed.

Figure 5H:
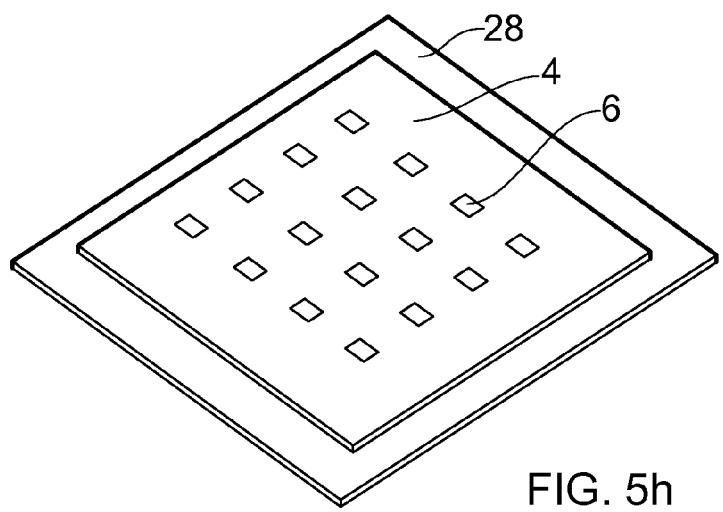

In FIG. 5H the exposed encapsulant 4 has been polished to expose the back side of the silicon substrate 6.

Figure 5I:
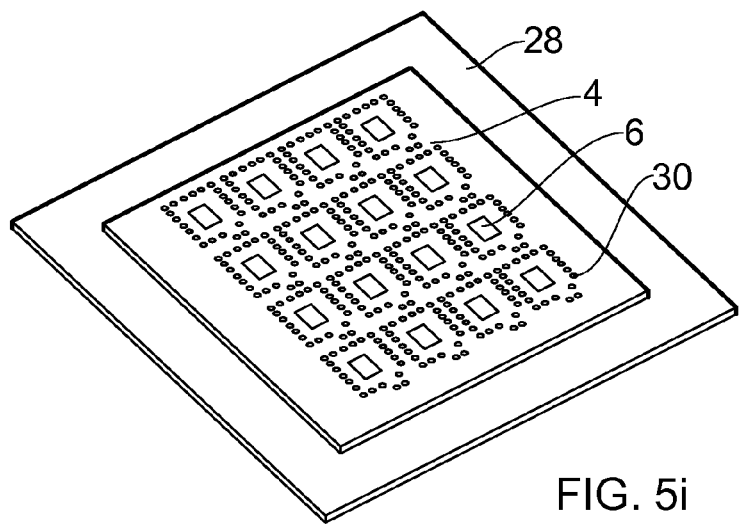

In FIG. 5I the structure can be photographically patterned and etched, to yield a configuration of holes through 30, the encapsulant 4, reaching up to the redistribution layer 8. Etching may be done by, for example, reactive ion etching. Alternatively, laser etching could be used to generate the holes through 30 the encapsulant 4 reaching up to the redistribution layer 8.

Figure 5J:
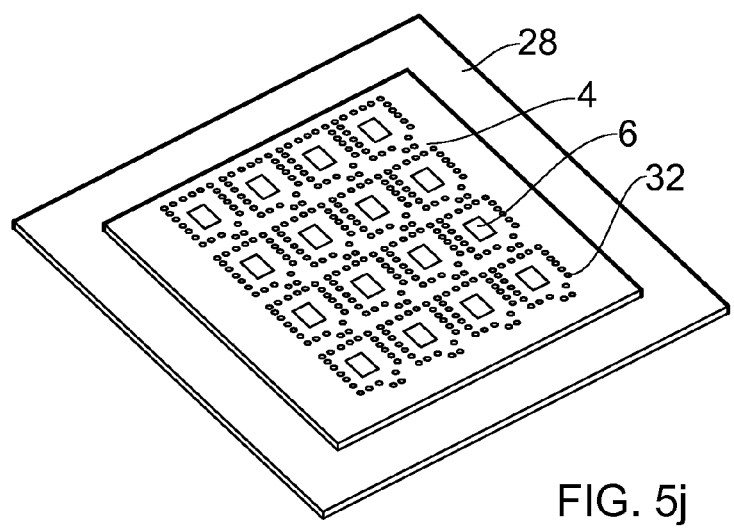

In FIG. 5J the holes through 30 the encapsulant 4 are filled with an electrically conductive material, such as a metal, for example copper, gold, aluminium using PVD, CVD, electrolytic plating electroless plating process or a combination hereof or other suitable metal deposition processes. In this manner the aforementioned vertically oriented conductive portions 16 are provided. A possible variant for arriving at the vertically oriented conductive portions 16 is by positioning a plurality of metal solid structures surrounding the semiconductor substrate 6 at the placement phase of the semiconductor substrate 6 on the first temporary support structure 22, and in this manner embedding the vertically oriented conductive portions in the encapsulant.

Figure 5K:
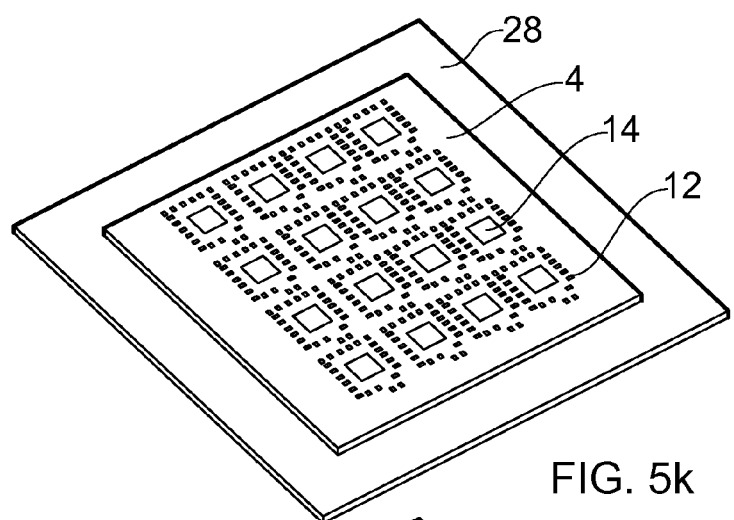
Figure 5L:
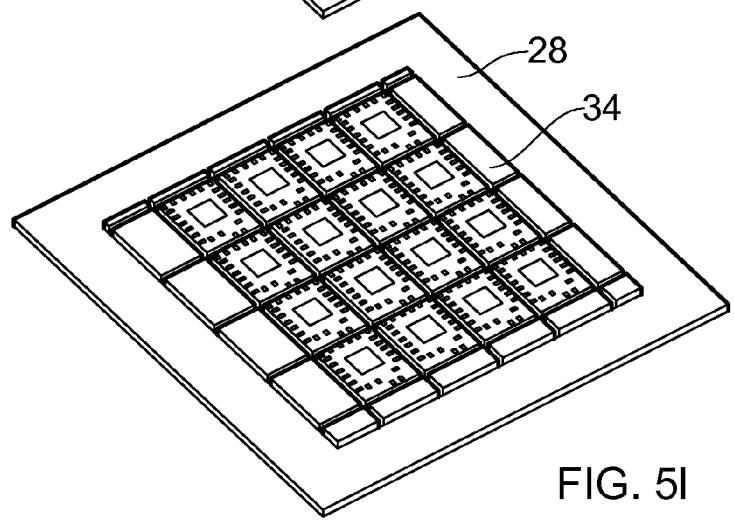

FIG. 5K provides an example of a completed pad ring 12 and heat spreader 14, which can be provided for in a similar manner as the redistribution layer has been applied in FIG. 5D. The heat spreader 14 is in contact with the back side of the semiconductor substrate 6, the pad ring 12 is in contact with the corresponding vertically oriented conductive portions 16. FIG. 5L shows how the completed semiconductor package 10 structures in a singulated configuration.

Figure 6A:
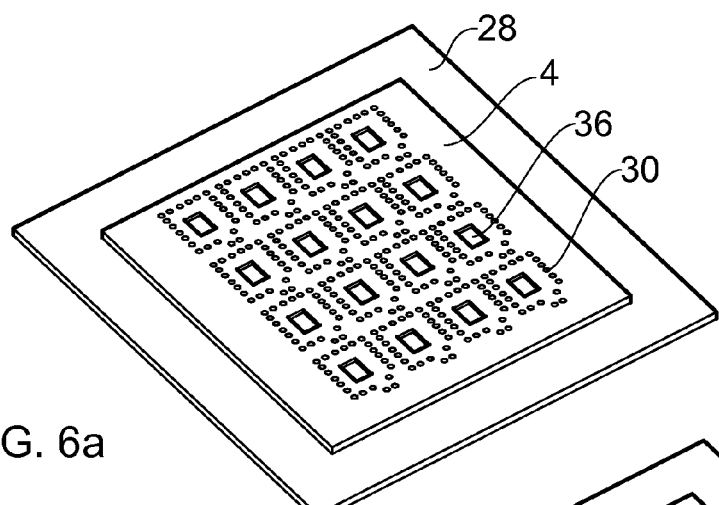
FIG. 6 shows a variant of the method shown in FIG. 5, exposing the back side of the semiconductor substrate.
Figure 6B:
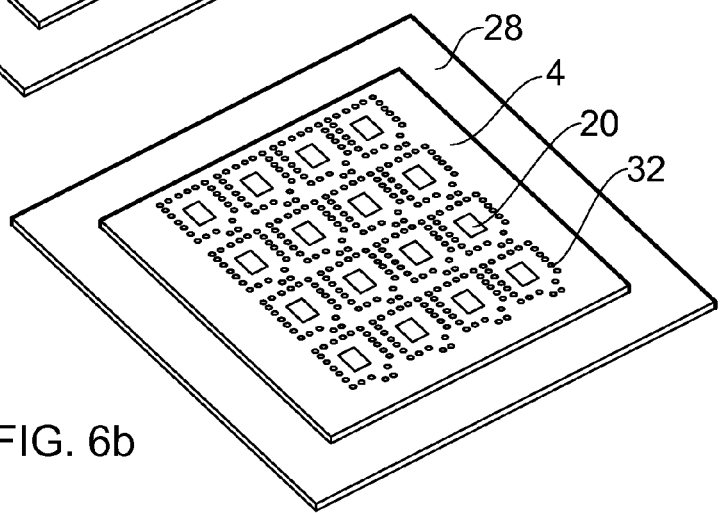

FIGS. 6A and 6B illustrate steps and processes of making another embodiment of the semiconductor package 10. In FIG. 6A the backside of the silicon substrate 6 is exposed by an etch process of the encapsulant 4, producing a recessed area 36 in the encapsulant 4 reaching up to the backside of the silicon substrate 4. The holes entirely through 30 the encapsulant 4 reaching up to the redistribution layer 8 have also been etched, the etch process may cater for simultaneous etching the holes entirely through 30 the encapsulant 4 reaching up to the redistribution layer 8 and the recessed area 36 of encapsulant 4 covering the semiconductor substrate 6 backside.

FIG. 6B shows the filling of the recessed area 36 as well as the holes 30 through the encapsulant 4 reaching up to the redistribution layer 8. The recessed area 36 is filled with a thermally conductive material 20 like a metal, up to the lower level of the semiconductor package 6. The holes 30 through the encapsulant 4 reaching up to the redistribution layer 8 are filled with an electrically conductive material like a metal. The deposition of the thermally conductive material as well as the electrically conductive material may be done with deposition techniques described before.

Figure 7A:
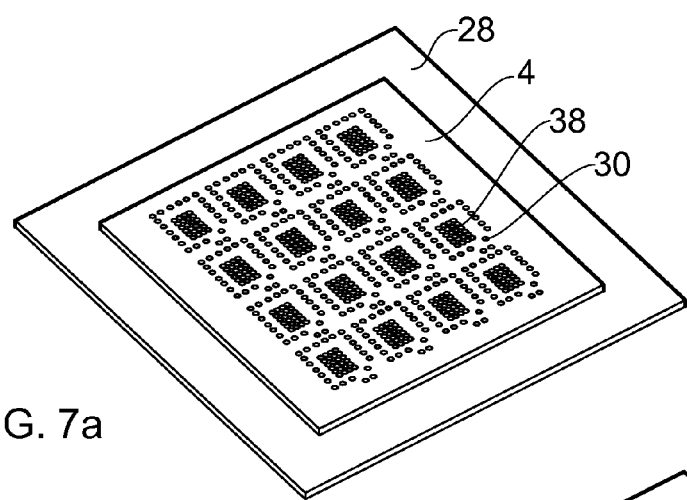
FIG. 7 shows another variant to the method of FIG. 5, including exposing the back side of the semiconductor substrate by etching vias through the encapsulant.
Figure 7B:
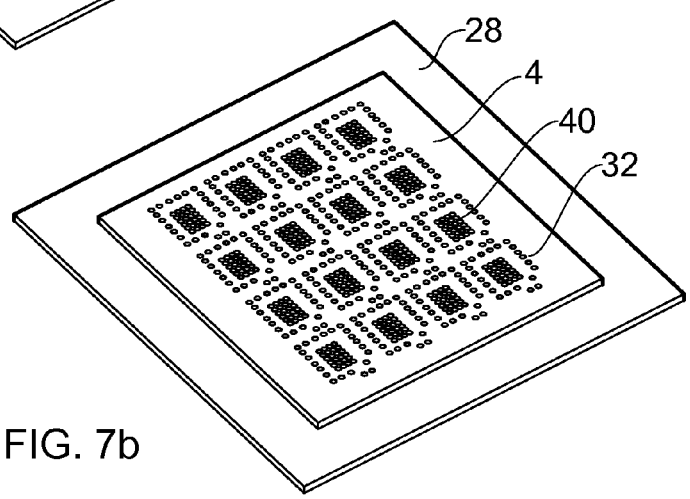

FIGS. 7A and 7B describe steps and processes of making another embodiment of the semiconductor package 10. In FIG. 7A the backside of the semiconductor substrate 6 is partly exposed by etching holes until reaching a semiconductor 38 in the encapsulant 4 reaching up to the semiconductor substrate 6 backside. The holes 30 through the encapsulant 4 reaching up to the redistribution layer 8 have also been etched. The etch process may cater for simultaneous etching the holes 30 and etching holes until reaching a semiconductor 38 in the encapsulant 4 up to the semiconductor substrate 6 backside.

FIG. 7B shows the filling of the holes 38 and the holes 30. The holes 38 are filled with a thermally conductive material 20 like a metal, up to the lower level of the semiconductor package 6 comprising holes filled with a thermally conductive material 40. The holes 30 are also filled with an electrically conductive material like a metal.

Accordingly, there has been described a semiconductor package that comprises an encapsulant which contains a semiconductor substrate, the package lower side being mountable on a surface. The semiconductor substrate backside is in close proximity of the semiconductor package lower side for improved thermal conductivity to the surface. The active side of the semiconductor substrate, facing the upper side of the semiconductor package, has a plurality of die contacts. A plurality of electrically conductive interconnects are connected to the die contacts and extend to the lower side of the semiconductor package for connecting the die contacts to the surface.

Although particular embodiments of the invention have been described, it will be appreciated that many modifications/additions and/or substitutions may be made within the scope of the claimed invention.

The invention claimed is:

1. A semiconductor package comprising:
   an encapsulant comprising:
      an upper side; and
      a lower side mountable on a surface;
   a semiconductor substrate in the encapsulant, the substrate comprising:
      a backside proximal the lower side of the encapsulant for thermal connection to the surface; and
      an active side distal the lower side of the encapsulant, the active side of the substrate including a plurality of die contacts;
   a plurality of electrically conductive interconnects extending to the lower side of the encapsulant for electrically connecting the die contacts of the substrate to the surface; and
   a heat spreader in thermal contact with the backside of the semiconductor substrate for aiding thermal connection to the surface.

2. The semiconductor package of claim 1, wherein the electrically conductive interconnects include a redistribution layer connected to the die contacts for lateral redistribution of the connections within the encapsulant.

3. The semiconductor package of claim 2, wherein the redistribution layer is connected to a pad ring located at the lower side of the encapsulant via vertically oriented electrically conductive portions embedded in the encapsulant.

4. The semiconductor package of claim 3, wherein the vertically oriented electrically conductive portions comprise vias.

5. The semiconductor package of claim 4, wherein the vias comprise a metallic material.

6. The semiconductor package of claim 1, wherein the heat spreader comprises a metallic material.

7. The semiconductor package of claim 6, wherein the backside coincides with the lower side of the encapsulant, and wherein the heat spreader covers at least part of the backside of the substrate and/or the lower side of the encapsulant.

8. The semiconductor package of claim 1, wherein the backside is recessed with respect to the lower side of the encapsulant and wherein thermally conductive material fills a recessed area defined by the recessed backside and the encapsulant.

9. The semiconductor package of claim 8, wherein the recessed area is partly filled with a thermally conductive material and partly filled with encapsulant.

10. The semiconductor package of claim 9, wherein the thermally conductive material in the recessed area is arranged in a plurality of vias.

11. The semiconductor package of claim 1, wherein the semiconductor substrate comprises a Radio Frequency (RF) circuit.

12. The semiconductor package of claim 1, wherein the heat spreader is operable to perform an electrical function.

13. The semiconductor package of claim 12, wherein the heat spreader is tied to ground.

14. A method of making a semiconductor package having improved thermal conduction to a surface, the method comprising;
   providing a semiconductor substrate having an active side and an opposing backside;
   applying an encapsulant for enclosing the semiconductor substrate such that the backside of the substrate is proximal to a lower side of the encapsulant, wherein the lower side of the encapsulant is mountable on said surface; and
   connecting a plurality of electrically conductive interconnects to die contacts on the active side of the semiconductor substrate for connecting the die contacts to the lower side of the encapsulant, and
   providing a heat spreader in thermal contact with the backside of the semiconductor substrate for aiding thermal connection to the surface, with the heat spreader the lower side of the encapsulant and the plurality of electrically conductive interconnects being arranged relative to one another to interface both the heat spreader and the interconnects with the surface along a common plane.

15. The method of claim 14, the method further comprising:
   providing a redistribution layer;
   connecting the redistribution layer to die contacts on the active side of the semiconductor substrate, and using the redistribution layer to spread the electrically conductive interconnects laterally outward; and
   applying an overmolding layer on top of the redistribution layer and configuring the overmolding layer with the redistribution layer to protect the active side of the semiconductor substrate and the redistribution layer from ambient influences.

16. The method of claim 15, the method further comprising:
   etching holes through the encapsulant, the etched holes extending up to the redistribution layer;
   forming vertically-oriented conductive portions by filling the etched holes with an electrically conductive material, wherein connecting the plurality of electrically conductive interconnects to die contacts on the active side of the semiconductor substrate includes connecting each of the electrically conductive interconnects to one of the vertically-oriented conductive portions;
   connecting a heat spreader to the back side of the semiconductor substrate; and
   connecting a pad ring to the vertically-oriented conductive portions.

17. The semiconductor package of claim 1, wherein
   the plurality of electrically conductive interconnects extend through the encapsulant from the upper side of the encapsulant to the lower side of the encapsulant,
   a portion of each of the electrically conductive interconnects at the upper side of the encapsulant is electrically connected to one of the die contacts,
   the heat spreader has a planar upper side in contact with the backside of the semiconductor substrate and a planar lower side, and
   the heat spreader being configured and arranged with the encapsulant and a portion of each electrically conductive interconnect to interface both the lower side of the heat spreader and the electrically conductive interconnects with the surface along a common plane when the lower side of the encapsulant is mounted to the surface, with the heat spreader being configured and arranged to aid the thermal connection to the surface by conducting heat, from the backside of the semiconductor substrate via the upper side of the heat spreader, to the surface via the lower side of the heat spreader.

* * * * *